United States Patent [19]

Hashimoto et al.

[11] Patent Number: 5,344,501
[45] Date of Patent: Sep. 6, 1994

[54] SOLAR CELL

[75] Inventors: Yuichi Hashimoto, Tokyo; Hisami Tanaka, Yokohama, both of Japan

[73] Assignee: Canon Kabushiki Kaisha, Tokyo, Japan

[21] Appl. No.: 35,576

[22] Filed: Mar. 23, 1993

[30] Foreign Application Priority Data

Mar. 23, 1992 [JP] Japan .................................. 4-094892

[51] Int. Cl.$^5$ ......................................... H01L 31/048
[52] U.S. Cl. ..................... 136/259; 136/251; 257/433; 257/788
[58] Field of Search ................ 136/251, 259; 257/684, 257/702, 788, 433

[56] References Cited

U.S. PATENT DOCUMENTS

| | | | |
|---|---|---|---|
| 4,322,261 | 3/1982 | Dubois | 156/280 |
| 4,963,196 | 10/1990 | Hashimoto | 136/257 |

FOREIGN PATENT DOCUMENTS

| | | | |
|---|---|---|---|
| 0024615 | 3/1981 | European Pat. Off. . | |
| 0357289 | 8/1988 | European Pat. Off. . | |
| 2426337 | 12/1979 | France | H01L 31/18 |
| 59-73942 | 4/1984 | Japan | B32B 7/10 |
| 60-88481 | 5/1985 | Japan | H01L 31/04 |
| 62-123782 | 6/1987 | Japan | 136/259 |
| 63-185071 | 7/1988 | Japan | 136/259 |
| 1-119072 | 5/1989 | Japan | 136/259 |
| 3-185769 | 8/1991 | Japan | 136/259 |

OTHER PUBLICATIONS

Patent Abstracts of Japan, vol. 10, No. 310, Oct. 1986 and JP-A-61-120 850, Jun. 1986.
Patent Abstract of Japan, vol. 15, No. 442, Nov. 1991 and JP-A-31-85-769, Aug. 13, 1991.
Patent Abstracts of Japan, vol. 14, No. 363 Aug. 1990 and JP-A-21-33-497, May 22, 1990.

*Primary Examiner*—Aaron Weisstuch
*Attorney, Agent, or Firm*—Fitzpatrick, Cella, Harper & Scinto

[57] ABSTRACT

A solar cell, comprising a solar cell unit and a protective layer formed on the solar cell unit, wherein said protective layer comprises a polymer formed by polymerization of a cyclotriphosphazene monomer represented by the following formula (I):

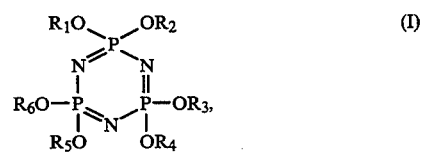

wherein $R_1$ to $R_6$ independently denote an ethylenically unsaturated polymerizable group. The cyclophosphazene monomer preferably contains $R_1$ to $R_6$ which are represented by the formula (I):

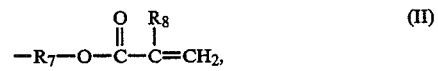

wherein $R_7$ denotes an alkylene group, arylene group, alkyl-substituted arylene group, alkylamide group arylamide group or polyoxyalkylene group, and $R_8$ denotes a hydrogen atom or a methyl group. The polymer obtained from the cyclotriphosphazene monomer is effective for providing a solar cell having high and stable output efficiency, mechanical durability, and good environmental stability.

12 Claims, 3 Drawing Sheets

SOLAR CELL

BACKGROUND OF THE INVENTION

Field of the Invention

The present invention relates to a solar cell, particularly a solar cell having a specific protective layer.

Solar cells have attracted attention as an energy supply means since solar cells are free from the problem of air pollution occurring in thermal or nuclear electric power generation and electrical energy can be obtained at any place merely if solar energy is available.

Under the existing circumstances, however, the production (i.e., manufacturing) cost of solar cells is expensive and the conversion efficiency (or energy conversion efficiency) thereof is not always sufficient. In addition, solar cells have a problem in durability, so that solar cells are not widely popular at the present time. In order to further popularize the solar cell, long-term outdoor durability in addition to an improvement in the conversion efficiency is required. A protective layer plays an important part in improving the durability and reliability of a solar cell under such conditions.

Further, an electrode constituting part of a solar cell is generally liable to be oxidized by moisture, so that it is preferable that the solar cell is protected from the outside by the medium of the protective layer to improve moisture resistance, weathering resistance, etc.

There have been proposed as protective layers for conventional solar cells materials comprising a resin film such as a polymethylmethacrylate or an epoxy resin film (Japanese Laid-Open Patent Application No. (JP-A) 88481/1985), a silicone resin film (French Patent No. (FR) 2426337), or a fluorine-containing resin film (JP-A 73942/1984).

These protective layers, however, have encountered respective inherent problems. The protective layer comprising a polymethylmethacrylate film has a low water-vapor resistance and is liable to crack. The protective layer comprising the epoxy resin film readily yellows and deteriorates under a high temperature and high humidity condition, thus hindering light transmission and decreasing conversion efficiency. The protective layer comprising the fluorine-containing resin film such as an ethylenetetrafluoroethylene copolymer film is susceptible to whitening which lowers the conversion efficiency. The protective layer comprising the silicone resin film is chemically stable but is expensive and also insufficient in surface hardness in some cases, thus hindering light transmission and decreasing the conversion efficiency.

SUMMARY OF THE INVENTION

An object of the present invention is to provide a solar cell having mechanical durability and excellent in environmental stability and further having high and stable energy conversion efficiency.

A solar cell according to the invention comprises a solar cell unit and a protective layer formed on the solar cell unit, wherein the protective layer comprises a polymer formed by polymerization of a cyclotriphosphazene monomer represented by the following formula (I):

wherein $R_1$ to $R_6$ independently denote an ethylenically unsaturated polymerizable group.

This and other objects, features and advantages of the present invention will become more apparent upon a consideration of the following description of the preferred embodiments of the present invention taken in conjunction with the accompanying drawings.

DETAILED DESCRIPTION OF THE INVENTION

The solar cell according to the present invention is characterized by having a protective layer comprising a polymer formed by polymerization of a cyclotriphosphazene monomer represented by the above-mentioned formula (I).

The polymer used in the present invention is excellent in various properties such as hardness, transparency, heat resistance, adhesion properties, surface smoothness, and surface lubricity. Since the polymer has a high density, water vapor hardly permeates the polymer, thus being excellent in water-vapor resistance.

By using the polymer, the solar cell of the present invention is free from mars, cracks, decrease in light transmittance, and oxidation of the solar cell unit even when used for a long period of time under not only normal temperature and humidity but also under high temperature and humidity.

In the formula (I), $R_1$ to $R_6$ may preferably include a group represented by the following formula (II):

wherein $R_7$ denotes an alkylene group, arylene group, alkyl-substituted arylene group, alkylamide group, arylamide group or polyoxyalkylene, and $R_8$ denotes a hydrogen atom or a methyl group.

The cyclotriphosphazene monomer of the formula (I) may be prepared through the following reaction scheme:

+ R$_{1-6}$—OH $\xrightarrow{-HCl}$

In the present invention, the hydroxy group R$_{1-6}$—OH may for example include: 2-hydroxyethyl acrylate, 2-hydroxyethyl methacrylate, 2-hydroxypropyl acrylate, 2-hydroxypropyl methacrylate, 1,3-butanediol monoacrylate, 1,3-butanediol monomethacrylate, 1,4-butanediol monoacrylate, 1,4-butanediol monomethacrylate, 1,6-hexanediol monoacrylate, 2-hydroxy-3-phenoxypropyl acrylate, 2-hydroxy-3-phenoxypropyl methacrylate, pentaerythritol monoacrylate, pentaerythritol monomethacrylate, pentaerythritol diacrylate, pentaerythritol dimethacrylate, pentaerythritol triacrylate, pentaerythritol trimethacrylate, 1,3-bis(3″-acryloxyethoxy-2′-hydroxypropyl)-5,5-dimethylhydantoin, 1,3-bis(3″-methacryloxyethoxy-2′-hydroxypropyl)-5,5-dimethylhydantoin, bisphenol A-diglycidyl-ether diacrylate, bisphenol A-diglycidyl-ether dimethacrylate, N-methylolacrylamide, N-methylmethacrylamide, polyethylene glycol monoacrylate, polyethylene glycol monomethacrylate, polypropylene glycol monoacrylate, and polypropylene glycol monomethacrylate.

The polymer used in the present invention may be formed by applying a coating liquid comprising a cyclotriphosphazene monomer of the formula (I) and an appropriate solvent onto an electrode described hereinafter, followed by drying and curing on exposure to light or heat. The light used for curing may be actinic radiation including ultraviolet rays, X-rays, and an electron beam. When the polymer is cured by exposure to light, the coating liquid may preferably contain a photoinitiator. The photoinitiator may be any one which can generate radicals on exposure to such actinic radiations, and may, for example, include photoinitiators of acetophenone-type, benzoin-type, benzophenone-type and thioxanthone-type generally used. The photoinitiator may preferably be added in a proportion of 0.1 to 50 wt. %, particularly 0.5 to 30 wt. %, of the total monomer.

In the present invention, the cyclotriphosphazene monomer of the formula (I) may be used singly to form a resin or in mixture of two or more species to form a copolymer. It is also possible to mix the cyclotriphosphazene monomer with another ethylenically unsaturated polymerizable monomer, preferably another acrylate or methacrylate monomer, to form a copolymer. In any case, the cyclotriphosphazene monomer may preferably be used in a proportion of at least 20 wt. %, particularly at least 30 wt. %, of the total monomer. Herein, the term "polymerization (or polymer)" means polymerization (or polymer) or copolymerization (or copolymer).

Further, the cyclotriphosphazene monomer can be used in mixture with another resin. Examples of such resin include: polyester, polycarbonate, polystyrene, polyvinyl chloride, cellulose resin, fluorine-containing resin, polyethylene, polypropylene, polyurethane, acrylic resin, epoxy resin, silicone resin, alkyd resin and various copolymers, such as vinyl chloride-vinyl acetate copolymer resin. In such a mixture, the cyclotriphosphazene monomer used in the present invention may be used in an amount constituting at least 5 wt. %, preferably at least 10 wt. %, more preferably at least 20 wt. %, particularly at least 30 wt. %, of the total of the cyclotriphosphazene monomer and another resin.

In order to effectively prevent adhesion of dust to the surface of the solar cell, the protective layer of the solar cell may preferably include conductive particles such as fine particles of a metal, an alloy, a metal oxide, carbon black, etc. Examples of the metal or alloy fine particles may include: those comprising aluminum, zinc, copper, chromium, nickel, stainless steel, silver, and alloys of these materials. Examples of the metal oxide fine particles may include: those comprising zinc oxide, titanium oxide, tin oxide, antimony oxide, indium oxide, bismuth oxide, indium oxide doped with tin (ITO), tin oxide doped with antimony, and zirconium oxide. Further, the conductive particles may also include those comprising plastic coated with the above metals, alloys, or metal oxides. These materials may be used singly or in combination of two or more species. When the above materials are used in combination of two or more species, they may be simply mixed or formed into a solid solution or a fused mixture. In the present invention, the metal oxide may preferably be used as the conductive particles in view of transparency etc.

In formulating the protective layer used in the present invention, the above-mentioned conductive particles may be contained in the protective layer in a proportion of 5–90 wt. %, preferably 10–80 wt. %. When the content of the conductive particles is below 5 w. %, the electrical resistance of the resultant protective layer tends to become too high, whereby dust and/or dirt readily adhere to the surface of the protective layer electrostatically. On the other hand, when the content of the conductive particles exceeds 90 wt. %, the resultant protective layer has a lower electrical resistivity, thus failing to function as a solar cell or causing a lowering of the output of the solar cell due to a decrease in transparency in some cases.

Generally speaking, when particles are dispersed in a resin component, it is preferable that the particle size of the dispersed particles is smaller than a wavelength of visible incident light (i.e., at most 0.3 micron) so as to minimize scattering of the visible incident light. In the present invention, the average particle size of the conductive particles in the protective layer may be at most 0.3 micron, preferably at most 0.1 micron, in view of the light transmittance required for the protective layer. Further, taking the possibility of formation of secondary particles during the dispersion step into consideration, the average primary particle size of the conductive particles before dispersion may be at most 0.1 micron, preferably 0.05 micron.

In the present invention, the average primary particle size of the conductive particles is measured by using a scanning electron microscope (SEM; magnification=10000). More specifically, the particle sizes of 100 arbitrarily chosen 100 conductive particles are measured by the SEM and the resultant mean value is taken as the average particle size. On the other hand, the average particle size of the conductive particles in the protective layer is obtained by measuring the particle sizes of 30 arbitrarily chosen conductive particles in the protective layer by means of a transmission electron microscope (TEM; magnification=10000) and calculating the mean value.

The cyclotriphosphazene monomer has 6 ethylenically unsaturated polymerizable groups ($R_1$ to $R_6$) and thereby exhibits a relatively high polarity. As a result, it is possible to sufficiently and uniformly disperse the above-mentioned fine conductive particles in the coating liquid since the cyclotriphosphazene monomer contained in the coating liquid has a high dispersing property. The thus-prepared coating liquid dispersion is stable for a long time and the protective layer formed by applying, drying and curing the coating liquid has a high transparency and a uniformly conductive property.

The thickness of the above-mentioned protective layer may be 10-200 microns, particularly 30-100 microns. Below 10 microns, the durability of the protective layer becomes insufficient in some cases. Above 200 microns, the transparency of the protective layer sometimes becomes too low.

The method for applying the above-mentioned polymer-containing coating liquid for formation of the protective layer may be: dipping, spray coating, spinner coating or beam coating.

Figure 1:
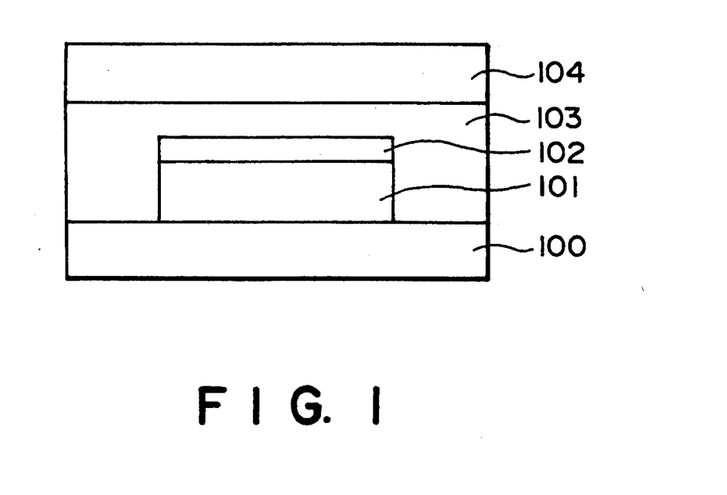
FIG. 1 is a schematic sectional view showing an embodiment of the solar cell according to the present invention.

FIG. 1 shows a schematic sectional view of an embodiment of the solar cell according to the present invention. Referring to FIG. 1, the solar cell comprises a photosensitive layer 101, a transparent electrode 102, an adhesive layer 103, and a protective layer 104 disposed in this order on an electrode 100 which also functions as a support. Herein, the electrode 100, the photosensitive layer 101 and the transparent electrode 102 are inclusively referred to as the "solar cell unit". Thus, the solar cell of the invention may comprise the protective layer 104, the adhesive layer 103, and the solar cell unit.

Figure 2:
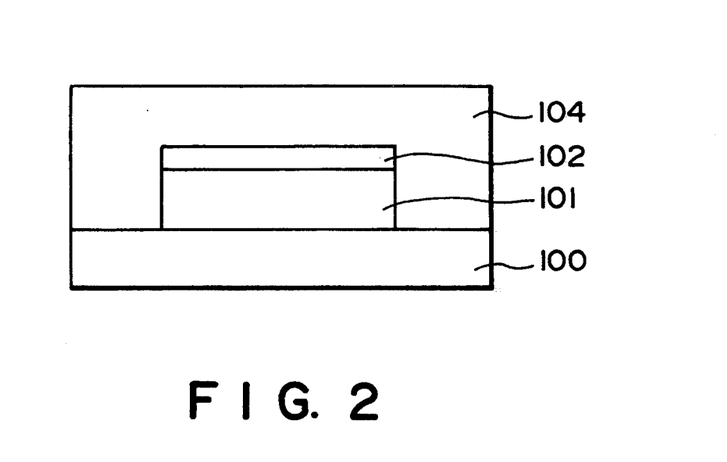
FIG. 2 is a schematic sectional view showing another embodiment of the solar cell according to the present invention.

FIG. 2 shows a schematic sectional view of another embodiment of the solar cell according to the present invention. In FIG. 2, the reference numerals 100, 101, 102, and 104 respectively denote the same constituents as described above (FIG. 1). In this instance, the solar cell comprises the protective layer 104 and the solar cell unit.

The solar cell unit used in the present invention may include the above-mentioned photosensitive layer and the above-mentioned two electrodes sandwiching the photosensitive layer therebetween. Referring to FIG. 1, the solar cell unit comprises the electrode 100, the photosensitive layer 101, and the transparent electrode 102 disposed in this order.

The photosensitive layer 101 as shown in FIG. 1 may include: one comprising an inorganic substance such as amorphous silicon (a-Si) or CdS/CdTe; and one comprising an organic substance such as phthalocyanine or its derivatives.

The electrodes 100 and 102 as shown in FIG. 1 may include: those comprising various metals, alloys, conductive metal oxides; and those comprising paper, plastic, or glass which has been subjected to conductive treatment with the above-mention metals, alloys or metal oxides. Examples of materials for the electrodes 100 and 102 include: aluminum, aluminum alloy, chromium, nickel, stainless steel, $In_2O_3$, and ITO. Since the electrode 102 used in the present invention is required to be transparent, preferred examples of the electrode 102 include those comprising the metal oxides such at $In_2O_3$ and ITO.

In the present invention, it is possible to dispose the adhesive layer 103 as shown in FIG. 1, which has transparency and comprises a resin as a principal component, between the protective layer and the solar cell unit in order to further enhance adhesive properties.

Examples of such a resin include: an acrylic resin such as polybutyl methacrylate; a butyral resin such a polyvinyl butyral; and an epoxy resin.

An example of a solar cell including a photosensitive layer comprising an a-Si as an embodiment of the solar cell of the present invention will be explained hereinbelow.

Figure 5:
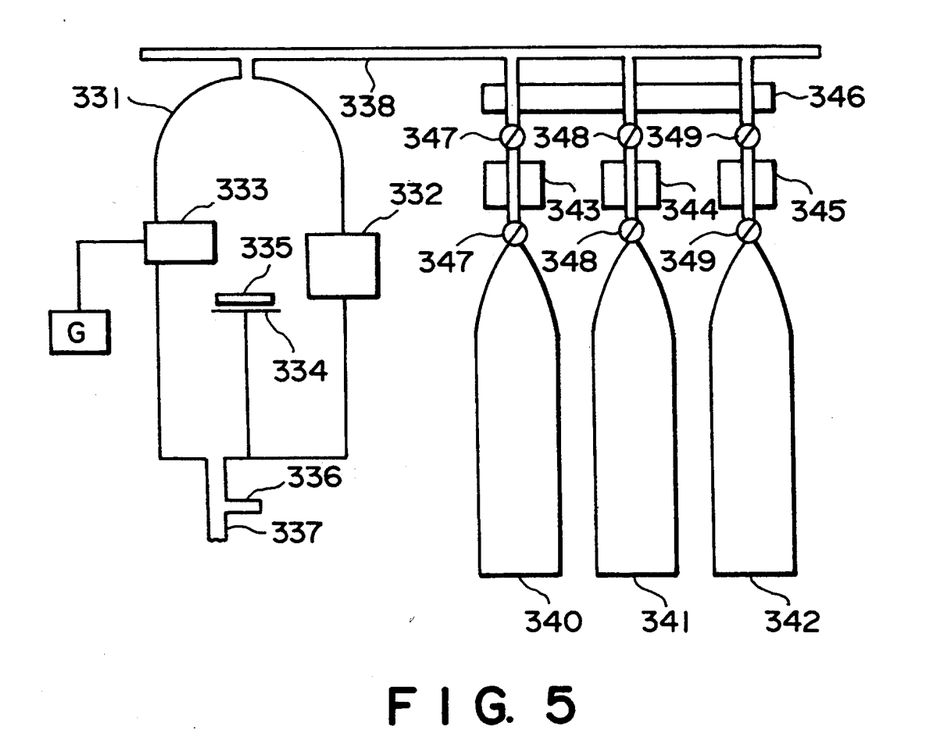
FIG. 5 is a schematic view of a radio frequency-chemical vapor deposition (RF-CVD) apparatus used in the examples and the comparative examples appearing hereinafter.

FIG. 5 is a schematic view showing an embodiment of a film-forming apparatus (RF-CVD apparatus) which can be used for producing the solar cell employing the a-Si. Referring to FIG. 5, the RF-CVD apparatus includes: a reactor (or reaction chamber) 331, a cathode 332, an anode 333, a heated turntable 334, a substrate 335 (as a conductive support), a pipe 336 connected to a vacuum gage, an exhaust vent 337, a gas feed pipe 338, steel gas cylinders 340, 341, and 342, flowmeters 343, 344, and 345, a cold trap 346, and flow control valves 347, 348, and 349.

An embodiment of the operation of the RF-CVD apparatus will be explained with reference to FIG. 5.

An exhaust pump (not shown) connected with the exhaust vent 337 is activated and the internal pressure of the reactor 331 is reduced to about $1 \times 10^{-6}$ Torr, followed by heating and rotating the heated turntable 334 with the substrate 335 disposed thereon. The flow control valves 347 and 348 are opened almost simultaneously with the above heating step, thus supplying $SiH_4/H_2$ gas mixture and $PH_3/H_2$ gas mixture from the steel gas cylinders 340 and 341, respectively, to the reactor 331.

An electrical power supply for discharge G is driven to apply a high-frequency electric field to the resultant gas mixture, whereby glow discharge is generated between the anode 333 and cathode 332. As a result, an n-type a-Si layer is deposited and formed on the substrate 335 and then the glow discharge is stopped. Then, the flow control valves 347 and 348 are closed to stop supply of the gas mixtures and residual gas in the reactor 331 is removed.

The valve 347 is opened to supply the $SiH_4/H_2$ gas mixture from the steel gas cylinder 340 to the reactor 331, thus generating glow discharge again. As a result, an i-type a-Si layer is deposited on the n-type a-Si layer and then the glow discharge is stopped. Then, the valve 347 is closed to stop supply of the gas mixtures and residual gas in the reactor 331 is removed.

The valves 347 and 349 are opened to supply the $SiH_4/H_2$ gas mixture and $B_2H_6/H_2$ gas mixture from the steel gas cylinders 340 and 342, respectively, to the reactor 331, thus generating glow discharge again. As a results a p-type a-Si layer is deposited on the i-type a-Si layer and then the glow discharge is stopped. Then, the valves 347 and 349 are closed to stop supply of the gas mixtures and residual gas in the reactor 331 is removed.

The thus-prepared n-type, i-type, and p-type a-Si layers are generally referred to as the "a-Si unit cell" and, herein, also referred to as the "photosensitive layer". In the present invention, an a-Si unit cell (photosensitive layer) may repetitively be laminated one or more times in order to increase the electromotive force thereof.

On the p-type a-Si layer of the above-prepared a-Si unit cell, a transparent conductive material comprising a metal oxide such as tin oxide or indium oxide is then formed by a known film-forming method such as an electron beam (vacuum) vapor deposition or a radio frequency (RF) sputtering process to obtain a transparent electrode or a transparent conductive layer.

An adhesive layer may optionally be disposed on the transparent conductive layer (electrode) and a coating liquid of the cyclotriphosphazene monomer in an appropriate solvent is applied onto the adhesive layer or the transparent conductive layer, followed by drying and curing with, e.g., ultraviolet light, to polymerize the cyclotriphosphazene monomer to form a protective layer. Thus, a solar cell according to the present invention is prepared. It is preferable that the above-mentioned operation is performed in a vacuum vessel or by applying pressure or heating to an adhesive surface so as not to generate a bubble between the adhesive layer and the protective layer when the protective layer is formed on the adhesive layer.

Hereinbelow, the present invention will be explained more specifically with reference to examples. It is however to be understood that the present invention is not restricted to these examples.

EXAMPLE 1

An a-Si unit cell was formed on an electrode (support) by using the above-mentioned RF-CVD apparatus as shown in FIG. 5 in the same manner as described above, under the following conditions (1)–(8):

(1) Electrode support used: A 0.5 mm thick stainless steel plate (size: 20 mm×20 mm) the surface of which has been subjected to mirror polishing.

(2) Volume ratio of each gas: $SiH_4/H_2=0.1$, $PH_3/H_2=5\times10^{-4}$, and $B_2H_6/H_2=5\times10^{-4}$.

(3) Volume mixing ratio of each gas mixture: $SiH_4/H_2:PH_3/H_2=100:1$ to 1000:1, and $SiH_4/H_2:B_2H_6/H_2=100:1$ to 1000:1.

(4) Gas pressure in reactor: 2 to 5 Torr.

(5) High-frequency output of electrical power supply for discharge G: 50 to 500 W (4 MHz).

(6) Temperature of stainless substrates when heated: 250° to 350° C.

Growth rate of each a-Si layer: $0.4\times10^{-4}$ to $1\times10^{-4}$ μm/sec for p-type and n-type a-Si layers, and $0.8\times10^{-4}$ to $3\times10^{-4}$ μm/sec for i-type a-Si layer.

(8) Thickness of each a-Si layer formed: 0.01 μm for n-type a-Si layer, 0.6 μm for i-type a-Si layer, and 0.003 μm for p-type a-Si layer.

The thickness of each a-Si layer can readily be controlled by adjusting, e.g., the deposition time. In the Examples and Comparative Examples appearing hereinafter, the above-mentioned thicknesses of the a-Si layers were employed.

Then, on the thus-prepared a-Si unit cell (photosensitive layer) formed on the electrode (support), an $In_2O_3$ electrode of a thickness of 0.05 μm was formed by the RF sputtering process mentioned above to prepare a solar cell unit.

Separately, a coating liquid for a protective layer was prepared by mixing 60 wt. parts of a cyclotriphosphazene monomer of the following formula:

0.1 wt. part of 1-hydroxycyclohexylphenylketone, and 100 wt. parts of toluene. The coating liquid was applied onto the above-prepared $In_2O_3$ electrode by spray coating, followed by drying for 30 minutes at 120° C. and exposure to a high-pressure mercury lamp for 30 seconds at a light intensity of 8 mW/cm² (radiation distance= 70 cm) to form a protective layer in a thickness of 100 μm. Thus, a solar cell according to the present invention was prepared.

The thus-prepared solar cell having the protective layer (Example 1) and a separate solar cell prepared in the same manner as in Example 1 except for omitting the protective layer were subjected to a weathering resistance test for 2000 hours by using a xenon fadeometer (FAL-25 AX-HC.B.EC, mfd. by Suga Shikenki K.K.).

Figure 3:
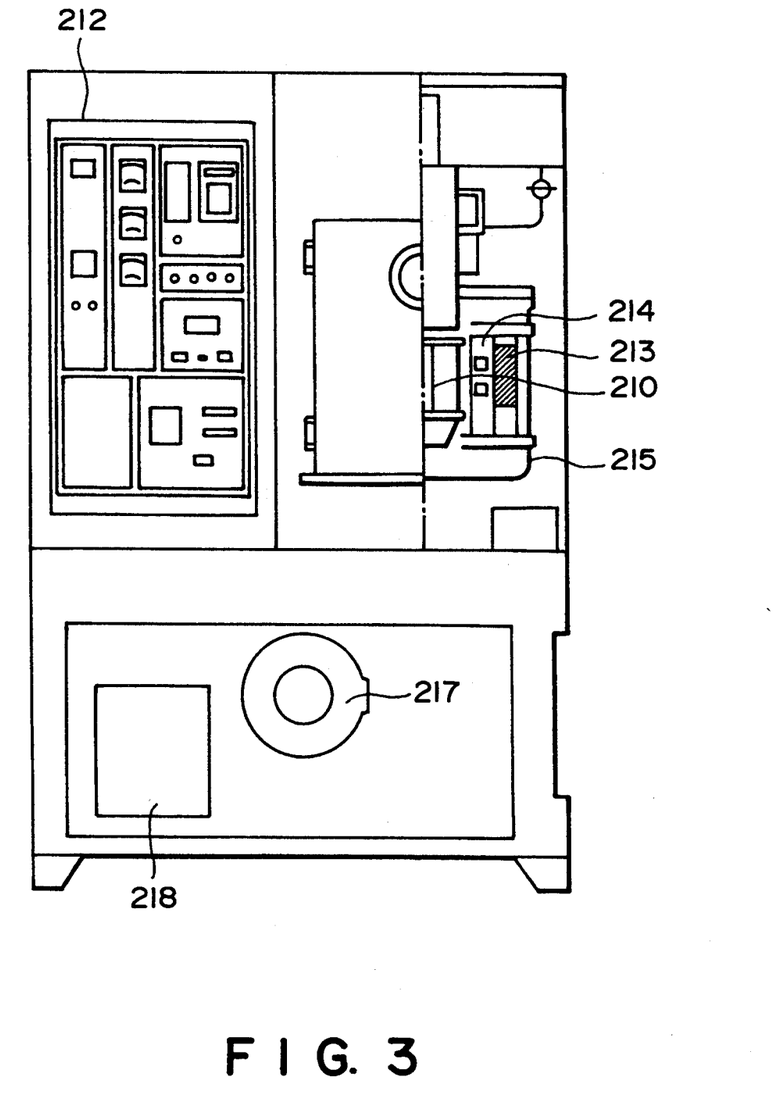
FIG. 3 is a schematic view of a weathering resistance testing apparatus used in the examples and comparative examples appearing hereinafter.
Figure 4:
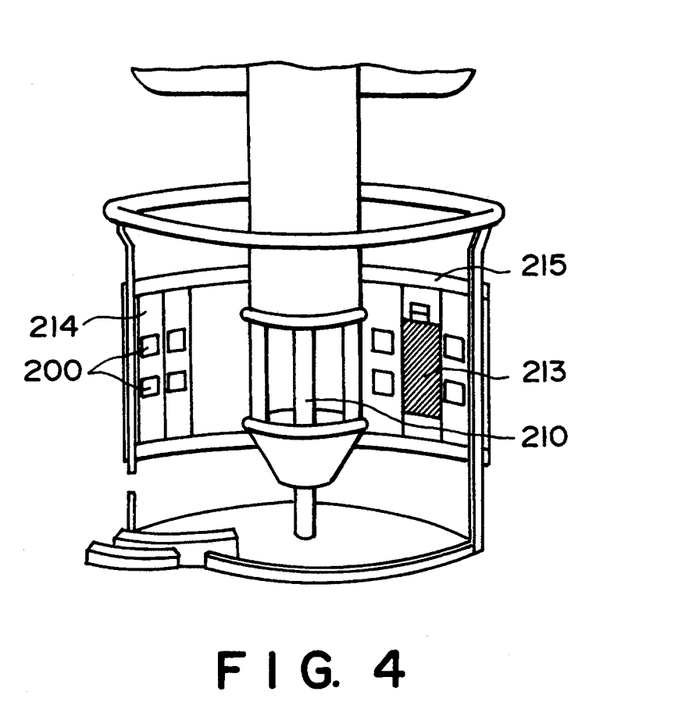
FIG. 4 is a partially enlarged view showing an internal structure of a test chamber of the weathering resistance testing apparatus shown in FIG. 3.

FIGS. 3 and 4 are schematic views showing an embodiment of the structure of the testing apparatus (xenon fadeometer) used herein. More specifically, FIG. 3 shows a front view thereof and also shows the structure of a part of an internal test chamber. FIG. 4 shows a partially enlarged view of the internal test chamber.

Referring to FIG. 3, a control panel 212 equipped with, e.g., instruments and switches necessary for the operation of the testing apparatus is disposed at the upper left of the apparatus body. A test chamber is disposed inside at the upper right of the apparatus body and includes a xenon lamp 210 disposed at the center thereof and a sample rotating frame 215 rotated upon the xenon lamp 210. At the lower part of the testing apparatus, a mechanical device equipped with, e.g., a blower 217 and a transformer 218 is disposed.

The above-mentioned testing apparatus was used for the weathering resistance test. The weathering resistance test was performed in the following manner.

First, a test sample 200 was placed in a sample holder 214 fitted in a sample rotating frame 215 as shown in FIG. 4 and the testing temperature was controlled so that a black panel thermometer 213 fitted in the sample rotating frame 215 provided a measured value of 63°±3° C. As a result, the inside of the test chamber had a temperature of about 45° C. The humidity thereof was set to 50% RH.

Then, the illuminance of the xenon lamp 210 was set so that a radiation illuminance meter (not shown) fitted in the inside of the testing apparatus provided a measured value of 0.5±0.02 W/m² at a wavelength of 340 nm.

The test sample 200 was rotated so as to be uniformly exposed to light. Under the above conditions, the irradiation of light was performed for 2000 hours (a durability test).

The output (W) of the tested samples was measured at an initial stage and after 2000 hours. The ratio of each output to that at an initial stage with respect to the test sample having no protective layer was evaluated as "output efficiency". In this instance, the output efficiency of the test sample at the initial stage is represented by 100. Further, the surface condition of the test sample after 2000 hours of weathering resistance was observed by the naked eye.

The results are shown in Table 1 appearing hereinafter.

EXAMPLE 2

A solar cell was prepared and evaluated in the same manner as in Example 1 except that a cyclotriphosphazene monomer shown below was used to form a protective layer in a thickness of 50 μm.

The results are shown in Table 1.

EXAMPLE 3

A solar cell was prepared and evaluated in the same manner as in Example 1 except that a cyclotriphosphazene monomer shown below was used to form a protective layer in a thickness of 80 μm.

The results are shown in Table 1.

COMPARATIVE EXAMPLE 1

A solar cell unit was prepared in the same manner as in Example 1.

A 100 μm-thick polymethylmethacrylate film (BR-80, manufactured by Mitsubishi Rayon Co., Ltd.) was applied onto the solar cell unit through the medium of a 50 μm thick ethylene-vinyl acetate copolymer hot-melt adhesive by a commercially available iron at 130° C. to effect hot-melt coating.

The thus-prepared solar cell was evaluated in the same manner as in Example 1. The results are shown in Table 1.

COMPARATIVE EXAMPLE 2

A solar cell was prepared in the same manner as in Example 1.

A 100 μm thick polyvinyl fluoride film (Tedlar, manufactured by Du Pont) was applied onto the solar cell unit through the medium of a 50 μm thick ethylenevinyl acetate copolymer hot-melt adhesive by a commercially available iron at 130° C. to effect hot-melt coating.

The thus-prepared solar cell was evaluated in the same manner as in Example 1. The results are shown in Table 1.

COMPARATIVE EXAMPLE 3

A solar cell unit was prepared in the same manner as in Example 1.

Onto the solar cell unit, a solution of 10 wt. parts of an epoxy resin (Epicoat, manufactured by Yuka Shell Epoxy K.K.) in 20 wt. parts of toluene was applied by spray coating, followed by drying at 130° C. to form a 100 μm thick protective layer.

The thus-prepared solar cell was evaluated in the same manner as in Example 1. The results are shown in Table 1.

COMPARATIVE EXAMPLE 4

A solar cell unit was prepared in the same manner as in Example 1.

Onto the solar cell unit, a room temperature vulcanizing (RTV) silicone resin (7022, mfd. by Shinetsu Kagaku Kogyo K.K.) was applied by bar coating. The wet coating was dried and hardened by being left to stand for one day to form a 100 μm thick protective layer.

The thus-prepared solar cell was evaluated in the same manner as in Example 1. The results are shown in the following Table 1.

TABLE I

| Ex. No. | Output efficiency (%) | | Surface state of protective layer |
|---|---|---|---|
| | Initial | After 2000 hrs. | After 2000 hrs. |
| Ex. | | | |
| 1*1 | 100 | 0 | *2 |
| 1 | 91 | 90 | Not changed |
| 2 | 94 | 92 | Not changed |
| 3 | 92 | 91 | Not changed |
| Comp. Ex. | | | |
| 1 | 94 | 60 | *3 |
| 2 | 62 | 58 | Not changed |
| 3 | 78 | 60 | *4 |
| 4 | 92 | 64 | *5 |

*1 The solar cell having no protective layer
*2 The electrode was corroded and the a-Si layer (photosensitive layer) was peeled off the electrode.
*3 The protective layer was broken.
*4 The protective layer yellowed.
*5 Numerous cracks occurred.

As is apparent from Table 1, the solar cells prepared in Examples 1–3 showed a stable output efficiency (i.e., the decrease in the output efficiencies after 2000 hrs. was only 1 or 2%) and the surface condition of the protective layer was not changed after 2000 hrs. On the other hand, the conventional solar cells prepared in Comparative Examples 1–4 had disadvantages such as a low output efficiency at an initial stage, a decrease in the output efficiencies (4 to 34%), and breaking or cracking of the protective layer.

EXAMPLE 4

Aluminum was vapor deposited on a glass plate (size: 100 mm × 100 mm) in a vacuum to form an aluminum electrode (support).

Then, 4 parts of oxytitaniumphthalocyanine, 1 part of a polyvinyl butyryl (S-LEC BM-2, mfd. by Sekisui Kagaku Kogyo K.K.) and 100 parts of cyclohexane were mixed and dispersed by a sand mill with 1 mmϕ glass beads. To the dispersion, 100 parts of methyl ethyl ketone (MEK) was added, whereby a dilute dispersion was obtained.

The above-prepared aluminum electrode was dipped into the dilute dispersion, followed by drying for 10 minutes at 80° C. to form a photosensitive layer of a thickness of 0.5 μm.

On the photosensitive layer, a 0.05 μm thick ITO electrode was formed by vacuum vapor deposition.

A protective layer was formed on the ITO electrode in the same manner as in Example 1 except that the thickness of the protective layer was changed to 70 μm.

ciency of 75% after 100 hours. The condition of the surface of the protective layer of the solar cell was not changed after a weathering resistance test for 100 hours.

As described hereinabove, according to the present invention, there is provided a solar cell containing a specific polymer which has mechanical durability, transparency, and high and stable output efficiency for a long period of time.

What is claimed is:

1. A solar cell, comprising a solar cell unit and a protective layer formed on the solar cell unit, wherein said protective layer comprises a polymer formed by polymerization of a cyclotriphosphazene monomer represented by the following formula (I):

wherein $R_1$ to $R_6$ independently denote an ethylenically unsaturated polymerizable group.

2. A solar cell according to claim 1, wherein $R_1$ to $R_6$ in Formula (I) denote a group represented by the following formula (II):

wherein $R_7$ denotes an alkylene group, arylene group, alkyl-substituted arylene group, alkylamide group arylamide group or polyoxyalkylene group, and $R_8$ denotes a hydrogen atom or a methyl group.

3. A solar cell according to claim 1, wherein said protective layer comprises conductive particles.

4. A solar cell according to claim 3, wherein said conductive particles are selected from the group consisting of a metal, an alloy, a metal oxide, and carbon black.

5. A solar cell according the claim 4, wherein said conductive particles comprise a metal oxide.

6. A solar cell according to claim 3, wherein said conductive particles in the protective layer have an average particle size of at most 0.3 μm.

7. A solar cell according to claim 6, wherein said conductive particles in the protective layer have an average particle size of at most 0.1 μm.

8. A solar cell according to claim 3, wherein the conductive particles before dispersion have an average primary particle size of at most 0.1 μm.

9. A solar cell according claim 8, wherein said conductive particles before dispersion have an average primary particle size of at most 0.05 μm.

10. A solar cell according to claim 1, wherein said solar cell unit includes a photosensitive layer comprising an inorganic photoconductive substance.

11. A solar cell according to claim 1, wherein said solar cell unit includes a photosensitive layer comprising an organic photoconductive substance.

12. A solar cell according to claim 1, which further comprises an adhesive layer disposed between said solar cell unit and said protective layer.

* * * * *

UNITED STATES PATENT AND TRADEMARK OFFICE
CERTIFICATE OF CORRECTION

PATENT NO. : 5,344,501
DATED : September 6, 1994
INVENTOR(S) : YUICHI HASHIMOTO, ET AL.

Page 1 of 2

It is certified that error appears in the above-identified patent and that said Letters Patent is hereby corrected as shown below:

ON TITLE PAGE

In [56] References Cited, under OTHER PUBLICATIONS:
"Abstract" should read --Abstracts--.

In [57] ABSTRACT:
Line 7, "cyclophospha-" should read --cyclotriphospha- --.
Line 9, "formula (I):" should read --formula (II):--.
Line 11, "alkylamide group" should read
--alkylamide group,--.

COLUMN 1

After line 8, insert: --Description of the Prior Art--

COLUMN 4

Line 34, "5 w. %," should read --5 wt. %,--.
Line 63, "100" should be deleted.

COLUMN 5

Line 67, "at" should read --as--.

COLUMN 6

Line 7, "such a" should read --such as--.
Line 56, "results" should read --result,--.

COLUMN 7

Line 48, "Growth" should read --(7) Growth--.

UNITED STATES PATENT AND TRADEMARK OFFICE
CERTIFICATE OF CORRECTION

PATENT NO. : 5,344,501
DATED : September 6, 1994
INVENTOR(S) : YUICHI HASHIMOTO, ET AL.

It is certified that error appears in the above-identified patent and that said Letters Patent is hereby corrected as shown below:

<u>COLUMN 9</u>

Line 53, "ethylenevinyl" should read --ethylene-vinyl--.

<u>COLUMN 11</u>

Line 2, "Example 5" should read --Example 3--.
Line 6, "hours. The" should read --hours. ¶ The--.
Line 41, "ethylenevinyl" should read --ethylene-vinyl--.

<u>COLUMN 13</u>

Line 24, "$R_6$," should read --$R_6$--.
Line 33, "alkylamide group" should read
--alkylamide group,--.

Signed and Sealed this

Sixth Day of June, 1995

Attest:

BRUCE LEHMAN

*Attesting Officer*     *Commissioner of Patents and Trademarks*